United States Patent [19]

Ohno

[11] 4,237,607
[45] Dec. 9, 1980

[54] METHOD OF ASSEMBLING SEMICONDUCTOR INTEGRATED CIRCUIT

[75] Inventor: Hideshi Ohno, Sayama, Japan

[73] Assignee: Citizen Watch Co., Ltd., Tokyo, Japan

[21] Appl. No.: 908,709

[22] Filed: May 23, 1978

[30] Foreign Application Priority Data

Jun. 1, 1977 [JP] Japan .................. 52-64123

[51] Int. Cl.³ .............................. H05K 3/34
[52] U.S. Cl. ...................... 29/840; 29/841; 29/577 R; 174/68.5; 427/282
[58] Field of Search .......... 427/282; 29/626, 577, 29/627; 174/68.5; 209/15

[56] References Cited

U.S. PATENT DOCUMENTS

| 3,373,481 | 3/1968 | Lins et al. | 174/68.5 X |
|---|---|---|---|
| 3,403,438 | 10/1968 | Best et al. | 174/68.5 X |
| 3,429,040 | 2/1969 | Miller | 174/68.5 X |
| 3,495,133 | 2/1970 | Miller | 174/68.5 X |
| 3,561,107 | 2/1971 | Best et al. | 174/68.5 X |
| 3,647,533 | 3/1972 | Hicks | 427/282 X |
| 3,724,068 | 4/1973 | Galli | 29/626 |
| 3,739,462 | 6/1973 | Hasty | 29/577 |

FOREIGN PATENT DOCUMENTS 1120583  7/1968  United Kingdom .................. 204/15

Primary Examiner—Francis S. Husar
Assistant Examiner—C. J. Arbes

[57] ABSTRACT

A method of assembling a semiconductor integrated circuit in which a semiconductor integrated circuit chip with bumps is bonded to a flexible film circuit substrate. The assembling method of the invention comprises a step of making the highest layer of the bump of solder or a low melting point metal treating the surface of the flexible film circuit substrate by gold-plating, and bonding the semiconductor integrated circuit chip and the flexible film circuit substrate with the former mounted face-down on the latter.

6 Claims, 8 Drawing Figures

METHOD OF ASSEMBLING SEMICONDUCTOR INTEGRATED CIRCUIT

BACKGROUND OF THE INVENTION

1. Field of the Invention

This invention relates to a semiconductor integrated circuit assembling method, particularly to an assembling method to effect wireless bonding.

2. Description of the Prior Art

Heretofore, the Mini Mod method has been proposed as an assembling method in which a semiconductor integrated circuit chip with bumps and a flexible film circuit substrate are combined. In the assembling method usually the bumps of the semiconductor integrated circuit chip are positioned to the leads of the flexible film circuit substrate respectively so as to be heated and pressured by means of a bonding tool and as the result, bonding is made. There have been proposed various combinations of the metal deposited at the upmost layer of the bump and the metal for surface treatment at the upmost layer of the lead. Among many methods, it is most popular to make the highest layer of the bump of gold, and the surface of the lead of tin, because its bonding characteristics are excellent.

However, many inconvenient problems arise when the Mini Mod method is applied to a timepiece and the flexible film circuit substrate is used as a circuit substrate of a timepiece. For example, it is very critical how the surface treatment of the flexible film circuit substrate is made in view of the combination of the bump and the lead. Where the bump is made of gold and the lead is made of tin, gold is far superior to tin in its corrosion resistance and long term stability, etc. when the other module components such as a crystal oscillating element, capacitor and display device of liquid crystal cells, etc. are soldered with each other to make electrically conductive connections. This is the reason why the so-called partially plating method is proposed in which the lead portion is made of tin, and the other fixture and contact portions are made of gold.

Further, there is proposed another method in which the flexible film circuit substrate is plated with tin, the semiconductor integrated circuit chip is bonded, the tin layer at the fixture and contacting portions of the module components are broken and then gold plating is effected.

However, these methods result in increased cost of the flexible film circuit substrate. Therefore, they are not preferable.

Where both the bump and lead made of gold, there is no problem in the reliability of the fixture and contacting portions at the module components, but the bonding pressure is increased due to the gold-to-gold junction of the bonding portions, the semiconductor integrated circuit chip is easily injured so that the yield is lowered and as the result, its cost is up. This is especially eminent in a digital watch that requires many pins on the semiconductor integrated circuit chip.

SUMMARY OF THE INVENTION

An object of the invention is to provide a semiconductor integrated circuit assembly method in which the above-described defects are eliminated.

Another object of the invention is to provide an improved assembly method requiring no expensive apparatus such as a bonding machine.

The other object of the invention is to provide an economical assembly method in which a low manufacture cost can be attained by automatic manufacturing and continuous processes.

In order to attain the above objects, an assembly method of the invention comprises a step of making the highest layer of the bump by solder, or comparatively low melting point metal. The surface of the flexible film circuit substrate is treated by gold-plating and the semiconductor integrated circuit chip is bonded with the flexible film circuit substrate with the chips downwardly mounted on the substrate.

BRIEF DESCRIPTION OF THE DRAWING

The above-mentioned and other features and objects of the present invention will become apparent with reference to the following description taken in conjunction with the accompanying drawings, wherein like referenced numerals denote like elements, and in which.

DETAILED DESCRIPTION OF THE INVENTION

Figure 1:
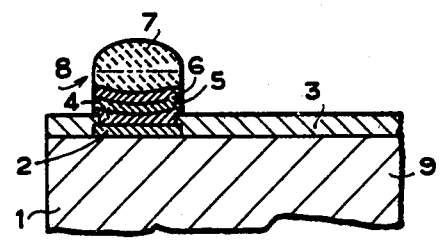
FIG. 1 is a partial and sectional view of a semiconductor integrated circuit chip showing one embodiment of this invention.

Each drawing shows an embodiment of this invention wherein FIG. 1 shows a semiconductor integrated circuit chip provided with a bump. FIG. 1 depicts a semiconductor integrated circuit chip substrate 1 made of silicon, an external connection electrode pad 2 of aluminum wiring, and a passivation layer 3 such as a silicon layer or a phosphorus glass layer. Reference numerals 4, 5, 6 denote barrier metal which serves to elevate the adhesion between a cap metal 7 deposited at the highest layer and the external connection electrode pad 2 made of aluminum. In this case the barrier metal 4 is made of chromium, the barrier metal 5 made of copper and the barrier metal 6 made of gold, and each being progressively formed by mask vapor deposition.

The cap metal 7 is made of solder and deposited by mask vapor deposition in the shape as shown by two dotted lines of FIG. 1. Then, the cap metal 7 is heated to cause it to rise up in a semi-circular shape as shown by a real line. Thus, the bump 8 is formed so that a semiconductor integrated circuit chip 9 (hereinafter abbreviated as IC chip) with the bump 8 can be manufactured.

Figure 2A:
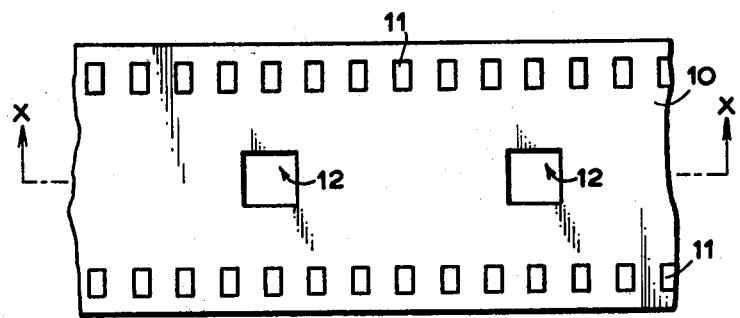
FIG. 2A is a partial and plan view of a base film of a flexible film circuit substrate showing one embodiment of this invention.
Figure 2B:
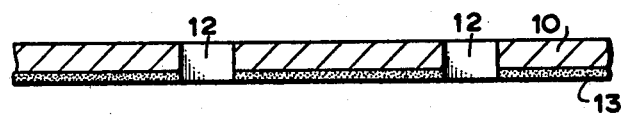
FIG. 2B is a sectional view along line X—X in FIG. 2A.

FIGS. 2A to 2E show manufacturing steps of a flexible film circuit substrate. In FIGS. 2A and 2B, reference numeral 10 illustrates a base film made of polyamide, i.e., a kind of heatproof high molecule weight resin on which there are formed index perforations 11 by punching for purposes of feeding and indexing in the longitudinal direction. Reference numeral 12 denotes windows formed by punching and the size of the window 12 is slightly larger than that of IC chip 9. A bonding layer 13 coats the lower side of the base film 10.

Figure 2C:
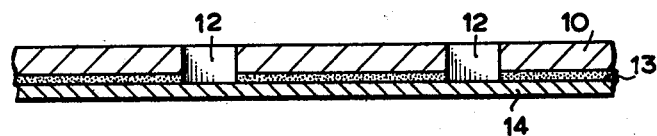
FIG. 2C is a sectional view to explain the condition under which the base film is laminated with copper foil.

FIG. 2C shows a construction in which the base film 10 is laminated with a copper foil. According to this method, the base film 10 and copper foil 14 are passed between heated and pressed rollers, and are cured to be solidified completely.

Figure 2D:
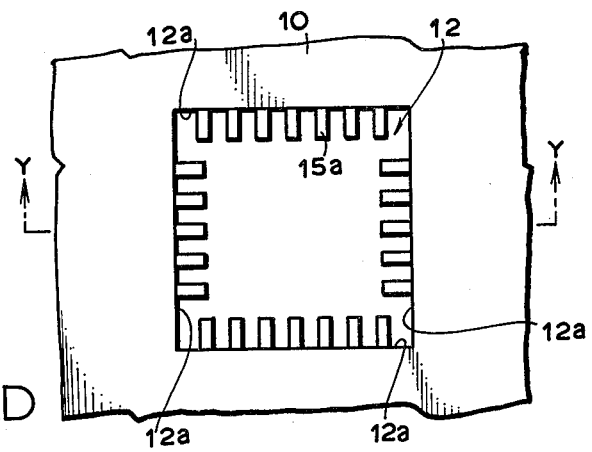
FIG. 2D is a plan view of a brief part of the flexible film circuit substrate which is completely made.
Figure 2E:
FIG. 2E is a sectional view along line Y—Y in FIG. 2D.

FIGS. 2D and 2E show manners in which the copper foil is etched to form a conductive pattern and to treat the surface thereof so as to form a flexible film circuit substrate. Reference numeral 15 indicates a conductive pattern provided with leads 15a protruding from the window 12. Gold plating is effecting on the conductive pattern 15 and lead 15a thereof. In the above-described steps, the flexible film circuit substrate 16 can be manufactured. In this case it is not preferable to plate gold over the whole area of the conductive pattern 15. Therefore, it is advantageous in cost to coat photoresist layer on the remaining portion except the leads 15a, fixing and contacting portions of the module components, test pattern for examination, etc. so as to effect gold plating as masking material of the photo resist, and as the result, the area plated by gold is reduced.

Further it is preferable to form a nickel layer as a substrate of gold plating in view of the fact that its reliability may be elevated by the dispersion of gold.

In the above embodiment, there has been described the flexible film circuit substrate 16 by bonding the copper foil 14 to the base film 10 to make them integral with each other. In order to make a flexible film circuit substrate 16 formed by coating the copper foil 14 with polyimide, the polyimide is deposited on the copper foil 14 by electrodeposition. In this case, the index perforations 11 may be formed by punching or etching and the windows 12 are also formed by etching. The succeeding steps of formation of the conductive pattern and surface treatment are identical with the corresponding steps set forth in the above-mentioned embodiment.

Figure 3:
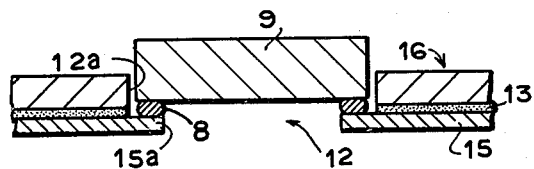
FIG. 3 is a sectional view showing the condition under which the semiconductor integrated circuit chip is bonded with the flexible film circuit substrate.

FIG. 3 shows a construction in which the IC chip 9 is bonded to the flexible film circuit substrate 16. According to this method, the IC chip 9 is downwardly inserted into the window 12 of the flexible film circuit substrate 16 with its face down. The wall 12a of the window 12 serves to position the IC chip 9. Under this condition, these members 9, 16 are passed through a furnace so that the cap metal 7 of the bump 8 may melt to be connected with the lead 15a. At this time the bonding conditions are 280° C. to 300° C. in temperature and 20 sec. in period. Therefore, in this method there is no requirement to increase pressure by a bonding machine like in the Mini Mod method. Since the cap metal 7 is made of solder, a slight misalignment between the IC chip 9 and the flexible film circuit substrate 16 can be self-compensated by surface tension when the solder melts. When other module components are soldered to the flexible film circuit substrate 16, it is preferable to have differences between the melting point of solder of the cap metal 7 and that of solder for component fixture. Where the module components are automatically attached, they may be attached at the same time when the IC chip 9 is attached. However, the difference of melting points of both solders is required when different steps are required.

Figure 4:
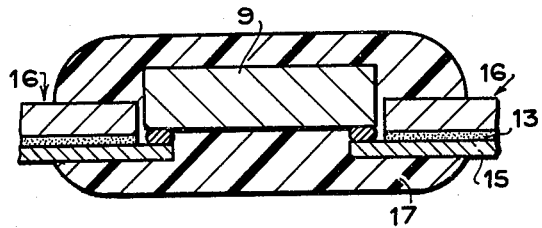
FIG. 4 is a sectional view showing an assembly of FIG. 3 which is coated with resin.

FIG. 4 shows the IC chip 9 and the flexible film circuit substrate 16, both being coated with resin, wherein reference numeral 17 depicts a resin coating made of epoxy resin or silicon resin, which is formed by a molding or potting method. Then, there are attached necessary module components. After the above-described steps, an examination of the product is made and the product is punched into the given shape so that a complete circuit substrate can be obtained.

In all of the above-described steps, the base film 10 is fed and positioned by the index perforations 11 of the flexible film circuit substrate 16 and the flexible film circuit substrate 16 of several tens of meters is wound by means of a reel and continuously treated.

According to this invention, the IC chip with bumps is bonded to a flexible film circuit substrate whereby high-speed manufacture can be automatically and continuously effected so as to provide inexpensive semiconductor integrated circuits.

Further, this invention provides a practical effect in that an expensive bonding machine is not required. Therefore, this invention is preferable in point of installations.

I claim:
1. A method of assembling a semiconductor integrated circuit comprising:
   (a) forming a bump on an external connecting electrode on a semiconductor integrated circuit chip;
   (b) first, bonding a copper foil to a base film made of heatproof high molecular weight resin;
   (c) etching said copper foil to form a conductive pattern on a flexible film circuit substrate;
   (d) forming an opening in said base film;
   (e) forming a portion of said conductive pattern projecting into said opening;
   (f) forming a solder layer as a cap metal of said bump on said semiconductor integrated circuit chip;
   (g) treating the surface of said conductive pattern on said flexible film circuit substrate with gold;
   (h) mounting said semiconductor integrated circuit chip in said opening, the chip being mounted face-down on said conductive pattern projecting into said opening; and
   (i) second, bonding said flexible film circuit substrate and the bump of said semiconductor integrated circuit chip, wherein the first bonding step includes forming the copper foil and the base film into a integral, unitary structure, the first bonding step further includes laminating the base film and the copper foil by coating the heatproof high molecular resin with the copper foil, and the first bonding step further includes pressing the base film and the copper foil between heated rollers thereby curing the copper foil and base film into a solidified, unitary structure.

2. A method of assembling a semiconductor integrated circuit comprising:
   (a) forming a bump on an external connecting electrode on a semiconductor integrated circuit chip;
   (b) first, bonding a copper foil to a base film made of heatproof high molecular weight resin;
   (c) etching said copper foil to form a conductive pattern on a flexible film circuit substrate;
   (d) forming an opening in said base film;
   (e) forming a portion of said conductive pattern projecting into said opening;
   (f) forming a solder layer as a cap metal of said bump on said semiconductor integrated circuit chip;
   (g) treating the surface of said conductive pattern on said flexible film circuit substrate with gold;

(h) mounting said semiconductor integrated circuit chip in said opening, the chip being mounted face-down on said conductive pattern projecting into said opening; and (i) second, bonding said flexible film circuit substrate and the bump of said semiconductor integrated circuit chip, wherein the second bonding step includes heating the flexible film circuit substrate and said semiconductor integrated circuit chip thereby melting the cap metal and bonding the bump to the conductive pattern on the flexible film circuit substrate and the step of heating is performed for 20 seconds at 280° to 300° C.

3. A method of assembling a semiconductor integrated circuit as claimed in claim 1 wherein other module components are soldered on said flexible film circuit substrate, a melting point of said solder of said cap metal is different from the melting point of a solder used for soldering said other module components.

4. A method of assembling a semiconductor integrated circuit as claimed in claims 2 or 1 wherein said base film is continuously fed and positioned by means of index perforations formed on said base film.

5. A method of assembling a semiconductor integrated circuit as claimed in claim 1 wherein said semiconductor integrated circuit chip and said flexible circuit substrate are continuously passed through a heating furnace to be bonded to each other.

6. A method of assembling a semiconductor integrated circuit as claimed in claim 1 wherein said semiconductor integrated circuit chip is positioned by the inner wall of said opening.

* * * * *